US007778029B2

(12) United States Patent
Ueno

(10) Patent No.: US 7,778,029 B2
(45) Date of Patent: Aug. 17, 2010

(54) SYSTEM COMPRISING HEAT-GENERATOR AND COOLER THEREOF, AND DISK ARRAY SYSTEM

(75) Inventor: Hidehiro Ueno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/035,750

(22) Filed: Feb. 22, 2008

(65) Prior Publication Data

US 2008/0205004 A1  Aug. 28, 2008

(30) Foreign Application Priority Data

Feb. 23, 2007  (JP) .............................. 2007-044059

(51) Int. Cl.
*H05K 7/20* (2006.01)
(52) U.S. Cl. ..................... 361/695; 165/80.3; 174/16.1; 454/184
(58) Field of Classification Search ........................ None
See application file for complete search history.

(56) References Cited

U.S. PATENT DOCUMENTS

| 4,851,965 | A | * | 7/1989 | Gabuzda et al. ............. 361/691 |
| 5,186,385 | A | * | 2/1993 | Karabin et al. .............. 236/1 G |
| 5,210,680 | A | * | 5/1993 | Scheibler ..................... 361/695 |
| 5,428,503 | A | * | 6/1995 | Matsushima et al. ........ 361/695 |
| 5,769,159 | A | * | 6/1998 | Yun ............................ 165/276 |
| 5,773,755 | A | * | 6/1998 | Iwatare .................... 174/17 VA |
| 6,016,250 | A | * | 1/2000 | Hanners ....................... 361/695 |
| 6,330,155 | B1 | * | 12/2001 | Remsburg .................... 361/695 |
| 6,330,157 | B1 | * | 12/2001 | Bezama et al. .............. 361/704 |
| 6,342,004 | B1 | * | 1/2002 | Lattimore et al. ........... 454/184 |
| 7,038,910 | B1 | * | 5/2006 | Hodge et al. ................. 361/690 |

FOREIGN PATENT DOCUMENTS

| JP | 2-108393 | | 8/1990 |
| JP | 0332495 | | 3/1991 |
| JP | 4-14896 | | 1/1992 |
| JP | 7-210257 | | 8/1995 |
| JP | 2000-187975 A | | 7/2000 |
| JP | 2004295718 A | * | 10/2004 |
| JP | 2005-20628 A | | 10/2005 |

* cited by examiner

*Primary Examiner*—Boris L Chervinsky
(74) *Attorney, Agent, or Firm*—Scully, Scott, Murphy & Presser, P.C.

(57) ABSTRACT

A system comprises: a plurality of heat-generators; at least one cooler that cools the heat-generators by letting a cooling medium flow; and at least one cooling medium flow regulator that regulates the amount of the flow of said cooling mediums in accordance to the heat of said heat-generators; wherein the heat of said heat-generators is transmitted to said cooling medium flow regulator without recourse to transmitting through said cooling medium or air. The system may be a disk array system.

7 Claims, 6 Drawing Sheets

SYSTEM COMPRISING HEAT-GENERATOR AND COOLER THEREOF, AND DISK ARRAY SYSTEM

REFERENCE TO RELATED APPLICATION

The present application is claiming the priority of the earlier Japanese patent application No. 2007-044059 filed on Feb. 23, 2007, the entire disclosure thereof being incorporated herein by reference thereto.

FIELD OF THE INVENTION

This invention relates to a system comprising a heat-generator and cooler thereof. The invention also relates to a disk array system comprising a plurality of magnetic disk devices as the heat-generator and a cooler thereof, for example.

BACKGROUND OF THE INVENTION

A system having a heat-generator such as an electrical device or electronic device often comprises a cooler to cool a heat-generator. A disk array system comprising a plurality of magnetic disk devices as the heat-generator is given as an example.

The disk array system has a plurality of the magnetic disk devices for reliability and fast processing or high capacity. The disk array system usually has a cooler such as a cooling fan to cool the magnetic disk devices since each magnetic disk device generates heat by, for example, an action of a motor.

The amount of heat released from the magnetic disk devices in the disk array system is, however, different any varies depending on the performance such as the rotation speed and the operation (access) status such as an idle status or seeking status. If the magnetic disk devices are cooled uniformly, a magnetic disk device having higher temperature can not be cooled selectively, which causes unevenness in the cooling.

It is known to control distribution of the cooling power according to each heat-generating state in the heat-generators.

In a disk array system according to Patent Document 1, for example, in order to prevent the unevenness of the cooling, temperature sensors are provided to detect the individual temperatures of magnetic disk devices as a heat-generator are provided to control the amount of the flow of the cooling air to the magnetic disk devices according to the individual temperatures.

In electronic devices according to Patent Documents 2 and 3, in order to cool a plurality of printed boards having electronic components as heat-generators, air-regulated plates, made from shape memory alloy, are provided for controlling the amount of the flow of the cooling air in the housing accommodating the printed boards to control the amount of the flow of the cooling air to the printed boards by changing the areas of openings according to the heat releases of the printed boards.

[Patent Document 1]
  JP Patent Kokai Publication No. JP-P2000-187975A

[Patent Document 2]
  JP Utility-Model Kokai Publication No, JP-U03-32495A

[Patent Document 3]
  JP Patent Kokai Publication No. JP-P2005-286268A

SUMMARY OF THE DISCLOSURE

The following analysis is given by the present invention. The entire disclosures of the above mentioned Patent Documents are herein incorporated by reference thereto. In the disk array system in which the amount of the flow of the cooling air is controlled by the temperature sensors, such as the disk array system according to Patent Document 1, the temperature sensors and fans in proportion to the number of the magnetic disk devices are necessary. The controllers to control the fans according to the measured values of the temperature sensors are also necessary. This causes problems that the disk array system becomes more complex and expensive and that the consumed power on the operation becomes greater. If the number of the temperature sensors and fans relative to the number of the magnetic disk devices is reduced in order to avoid the problem, it is difficult to get rid of the unevenness of the temperature in a plurality of the magnetic disk devices.

In the device in which the amount of the flow of the cooling air is controlled by the shape memory alloy (sheet) provided on the housing body, such as an electronic device according to Patent Documents 2 and 3, the heat of the printed boards is transmitted to the shape memory alloys of the printed boards through the air. Therefore, the shape memory alloys can not react to the change of the temperature of each printed board promptly. There is also a possibility that the heat generated in the printed board may not be suitably transmitted to the shape memory alloy corresponding to the printed board since the air in the housing flows by the cooling fans.

Accordingly, it is an object of the present invention to provide a system in which the distribution of the cooling power can be (promptly and suitably) controlled according to the state of the heat generation in each heat-generator. Also it is another object of the present invention to provide a disk array system in which the distribution of the cooling power can be controlled according to each amount of heat released by each of heat sources for example, magnetic disk devices promptly and suitably.

According to a first aspect of the present invention, there is provided a system comprising: a plurality of heat-generators (i.e., heat-generating sources); at least one cooler that cools the heat-generators by letting a cooling medium flow; and at least one cooling medium flow regulator that regulates the amount of the flow of the cooling medium in accordance to the temperature of the heat-generators. The heat of the heat-generators is transmitted to the cooling medium flow regulator without recourse to transmitting through the cooling medium or air.

According to a second aspect of the present invention, a disk array system is provided comprising: a plurality of magnetic disk devices; at least one ventilator that cools the magnetic disk devices; and at least one air flow regulator that regulates the amount of the flow of air to cool at least one of the magnetic disk devices in accordance to the heat of the magnetic disk device; wherein the heat of the magnetic disk devices being transmitted to the air flow regulator directly or through a conductor.

Particularly, the form of the air flow regulator may be changed according to the heat of the heat-generator.

BRIEF DESCRIPTIONS OF THE DRAWINGS

PREFERRED MODES OF THE INVENTION

In the system according to the first aspect of the present invention, following preferred modes are presented.

The heat of the heat-generators may be transmitted to the cooling medium flow regulator directly or through a conductor.

Each heat-generator may have at least one cooling medium flow regulator, and the cooling medium flow regulator may regulate the amount of the flow of the cooling medium which is in contact with the heat-generator to which the cooling medium flow regulator is assigned.

The cooling medium flow regulator may comprise a flow regulating member that deforms in accordance to the heat of the heat-generator; particularly, it may be made up of a shape memory material.

In the disk array system according to the second aspect of the present inventions following preferred modes are presented.

Each magnetic disk device may have at least one air flow regulator.

The air flow regulator may regulate the amount of the flow of air for cooling the magnetic disk device to which the air flow regulator is assigned (provided).

At least one air flow regulator may regulate the amount of the flow of air by regulating the width of a gap formed between an adjacent magnetic disk device and the air flow regulator.

The disk array system may comprise a plurality of the air flow regulators provided to the magnetic disk devices, a plurality of the air flow regulators being provided so as to face any air flow regulator provided to an adjacent one of magnetic disk devices.

The air flow regulator may comprise a flow regulating member that deform in accordance to the heat of the heat-generator; particularly, it may be made up of a shape memory material.

A system according to an example of the present invention which comprises a plurality of heat-generators and a cooler for cooling the heat generators will be explained illustrating a disk array system comprising a plurality of magnetic disk devices as the heat-generators.

Figure 1:
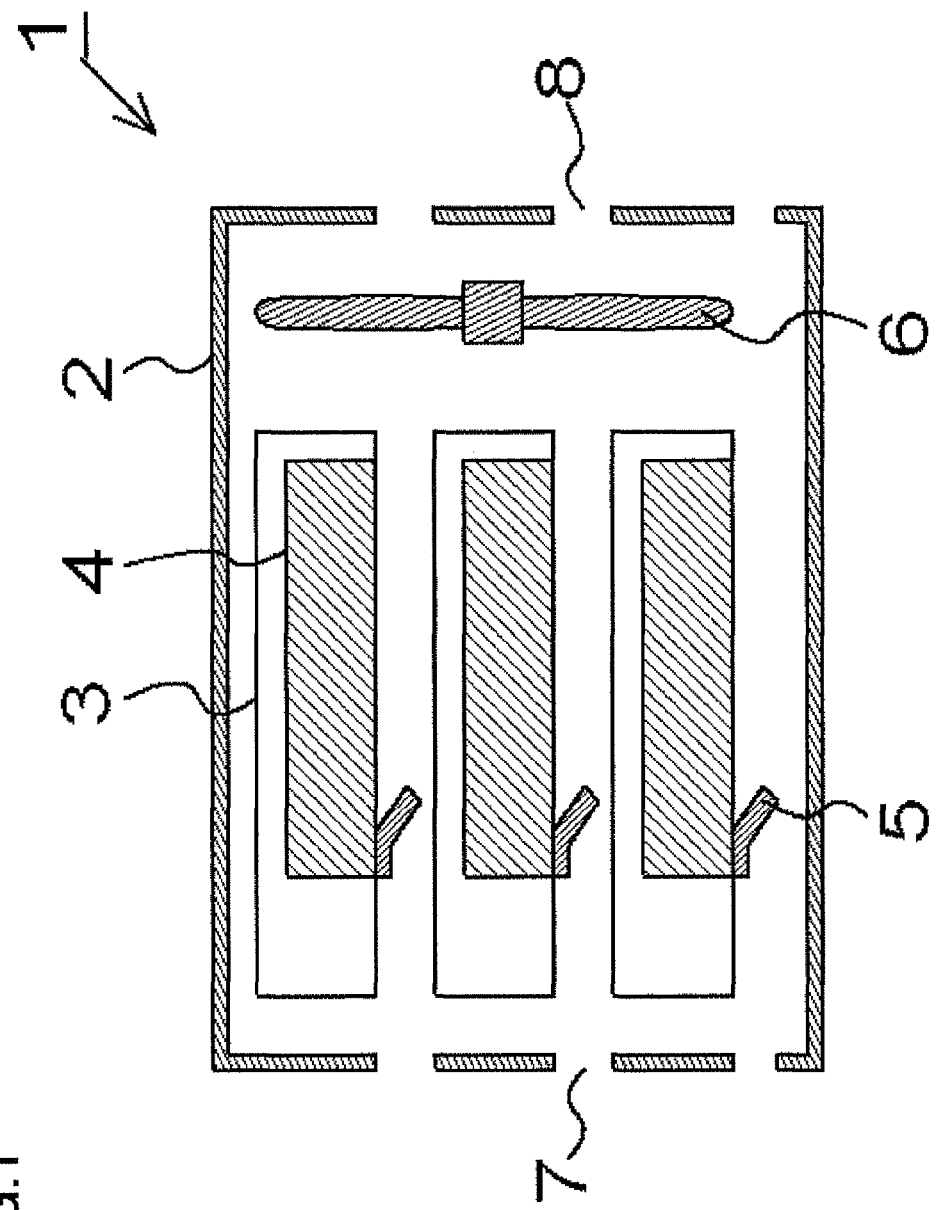
FIG. 1 is a schematic cross-sectional view of a disk array system according to a first example of the present invention.

A disk array system according to a first example of the present invention will be explained. FIG. 1 shows a schematic cross-sectional view of the disk array system according to the first example of the present invention. The disk array system 1 comprises a plurality of hard disk drives (HDDs) 4, which are magnetic disk devices, as the heat-generators. The HDDs 4 are installed in individual HDD units 3, respectively, and provided in the disk array system 1. The disk array system 1 further comprises at least one ventilator 6 as a cooler for cooling the HDDs 4, a power source unit (not shown) to provide a power for the HDD units 3 and ventilator 6, and a housing 2 for accommodating the HDD units 3 and ventilator 6. The HDD 4 includes a motor and actuator etc., besides a disk (platter) (not shown). The HDD unit 3 includes a guide rail and ejector lever for installation to the disk array system 1, a spring for avoiding static electricity, LED and so on (not shown) besides the HDD 4. The housing of the HDD unit 3 is made of a metal preferably, and even if the housing of the HDD unit 3 is mainly made of a resin, at least a part of the housing is made of a conductor (heat-conductive member) to transmit the heat of the HDDs 4 preferably.

The HDD units 3 are disposed in an arrayed fashion within the housing 2 interposed with a space between the neighboring HDD units 3, generally so as to provide vent channel(s), preferably on both the sides thereof.

The ventilator 6 lets air as a cooling medium flow in the housing 2, and a fan may be used as the ventilator 6, for example. The housing 2 has at least one vent for ventilation of the inside preferably and, according to the example shown in FIG. 1, has vents 7, 8 which serve as air intake and outlet openings in the opposite sides. In FIG. 1, the ventilator 6 provided near the vent 8 may discharge the air outward (toward the vent 8) or may let the air flow inward (toward the vent 7). According to this example, the air flows from the vent 7 to the vent 8. It is not necessary to increase or decrease the number of the ventilator according to the number of the HDDs 4, and the number of the ventilator 6 may be one as far as the ventilator 6 can provide the air as a cooling medium for all HDDs 4.

Each HDD unit 3 has a cooling medium flow regulator (an air flow regulator 5 in the present example) which regulates the amount of the flow of a cooling medium (the air in the present example) to cool the HDD 4. The air flow regulator 5 is provided in a place to which the heat of the HDD 4 can be transmitted without transmitting through the cooling medium or air preferably or can be transmitted through only a conductor more preferably. The air flow regulator 5 may be formed as a part of the HDD unit 3 to transmit the heat of the HDD 4 directly. The air flow regulator 5 may be formed from a member capable of deforming according to temperature or heat, typically a shape memory material, for example. The shape memory material is changeable according to the change of the temperature of the HDD 4 which is the heat-generator. The shape memory material may be selected according to the property from the group of, for example, shape memory alloy such as Ti—Ni alloy, Cu—Zn—Al alloy, Cu—Al—Ni alloy and Co—Ni alloy and shape memory resin such as polyester, polyurethane, styrene-butadiene, polynorbornene and trans-polyisoprene. The material, shape and size of the air flow regulators 5 may be individually determined according to the amount of heat release and shape of the HDD 4 and the state of the installation of the HDD unit 3.

Figure 2:
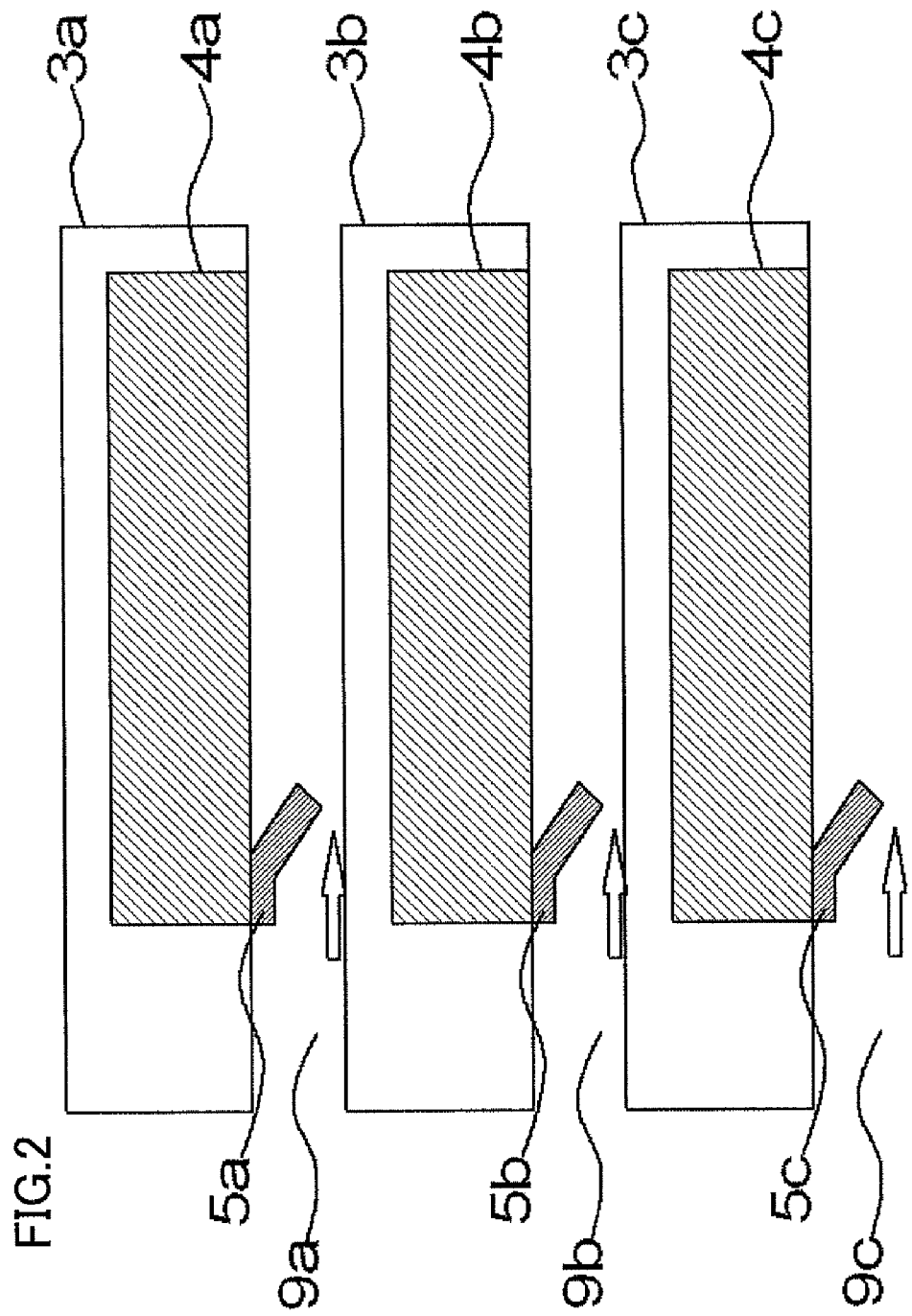
FIG. 2 is an enlarged schematic cross-sectional view of HDD units in the disk array system illustrating in FIG. 1.
Figure 3:
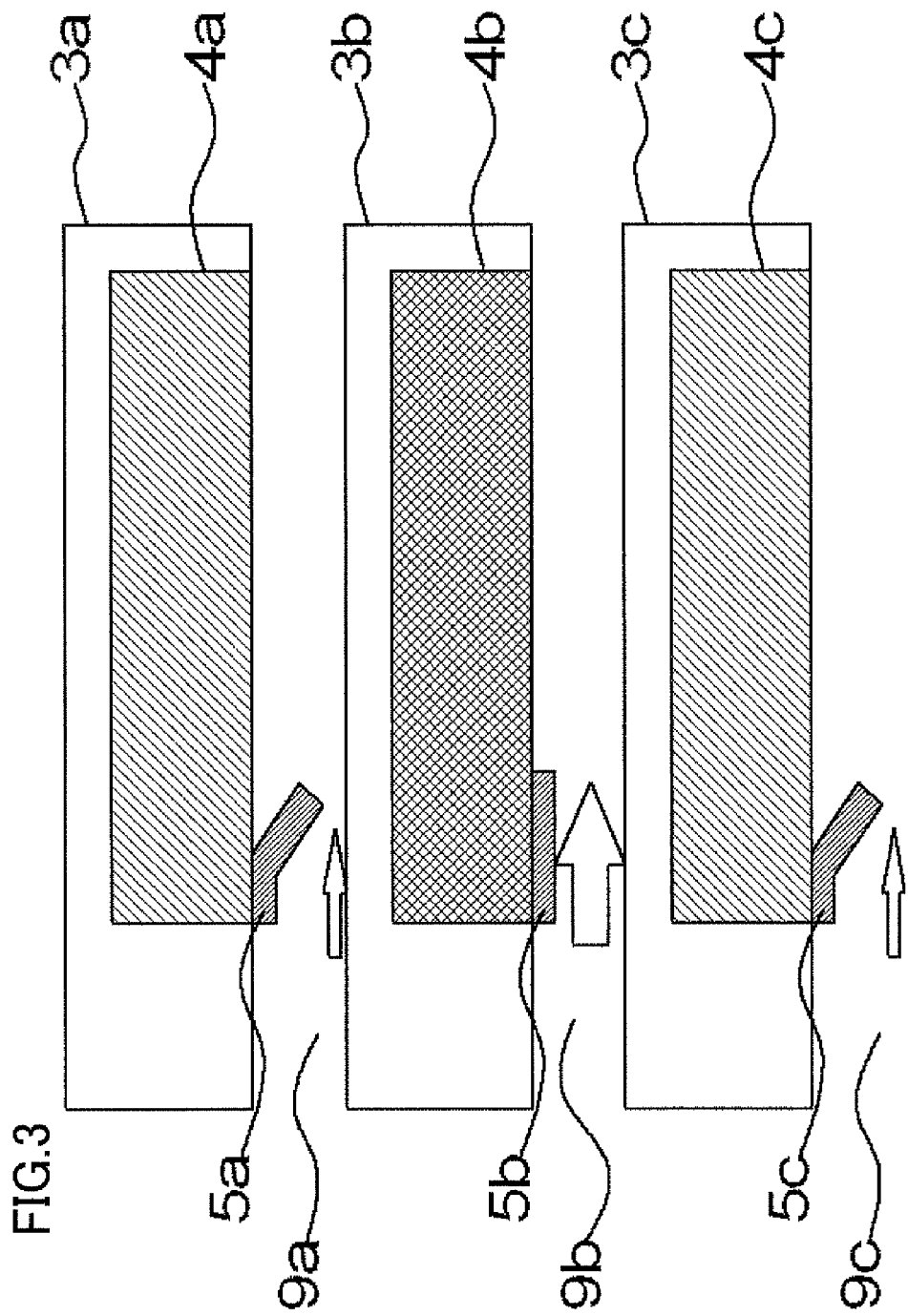
FIG. 3 is an enlarged schematic cross-sectional view of HDD units in the disk array system illustrating in FIG. 1.

The air flow regulator 5 is provided between two adjacent HDD units 3 or between the HDD unit and the housing 2 and functions like a flow control valve to regulate the amount of flowing air to cool the HDD 4 that the air flow regulator 5 is provided. FIGS. 2-3 show enlarged schematic cross-sectional views of the HDD units in the disk array system illustrating in FIG. 1. FIG. 2 shows a state in which the first to third HDDs 4a-4c are at a lower temperature (at a small amount of the heat release). FIG. 3 shows a state in which the second HDD 4b is at a higher temperature (at a higher amount of the heat release) while the first and third HDDs 4a, 4c remain at the lower temperature. If the first to third HDDs 4a-4c are all at the lower temperature, the first to third air flow regulators 5a-5c assume a form to close the gaps (first to third paths 9a-9c) between adjacent HDD units 3a-3c as shown in FIG. 2. According to an example shown in FIG. 2, the first to third air flow regulators 5a-5c are in the form of bent plates (L-shape or half-bent plates) and limit the mount of the air to cool the first to third HDDs 4a-4c by narrowing the first to third paths 9a-9c between the adjacent HDD units 3a-3c.

Next, if only the second HDD 4b becomes the state of a higher temperature, the heat is transmitted to the second air flow regulator 5b without being transmitted through the cool medium (air) and insulator and, preferably, through only a conductor. The heat changes the form of the second air flow regulator 5b to a flat-like plate at a predetermined (high or higher) temperature. Thus, as shown in FIG. 3, only the width of the second path 9b between the adjacent second and third HDD units 3b, 3c is broadened, and the amount of the flow of the air flowing through the second path 9b to cool the second HDD 4b of higher temperature increases as compared with the amount of the flow of the air flowing through the first and third paths 9a, 9c to cool the first and third HDDs 4a, 4c of lower temperature. This can regulate the amount of the flowing air according to the state of the heat releases of the first to third HDDs 4a-4c.

According to the first example, each air flow regulator for regulating the amount of the flow of the cooling medium to each heat-generator can react promptly and reliably according to the change of the temperature of each heat-generator. This means that the amount of the flow of the cooling medium distributed to each heat-generator can be changed promptly and reliably according to the heat release of each of the heat-generators.

Next, a disk array system according to a second example of the present invention will be explained. In the first example, the air flow regulator is provided on only one surface of each HDD unit, whereas, in the second example, the air flow regulators are provided on both surfaces of each HDD unit.

Figure 4:
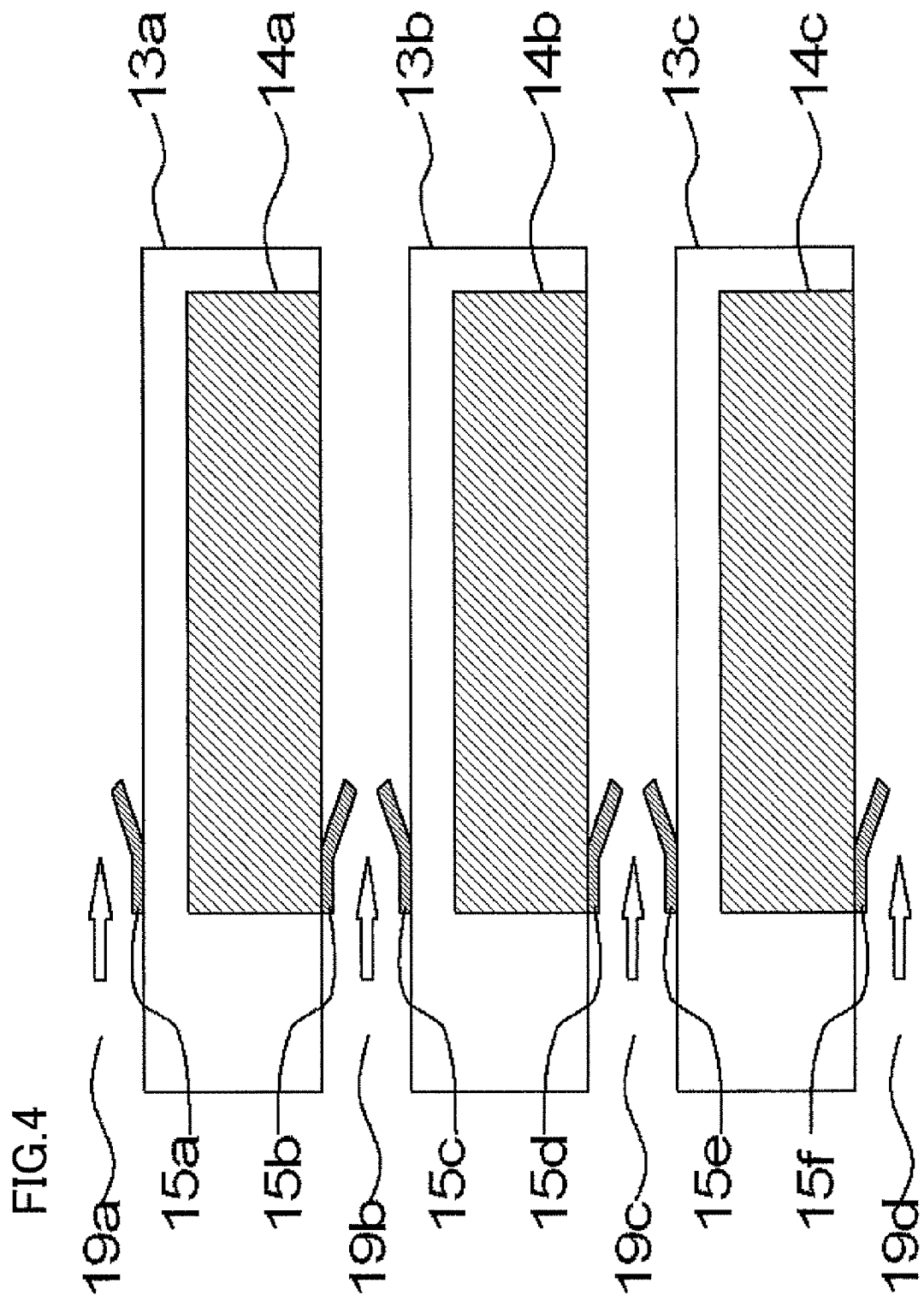
FIG. 4 is an enlarged schematic cross-sectional view of HDD units in a disk array system according to a second example of the present invention.
Figure 5:
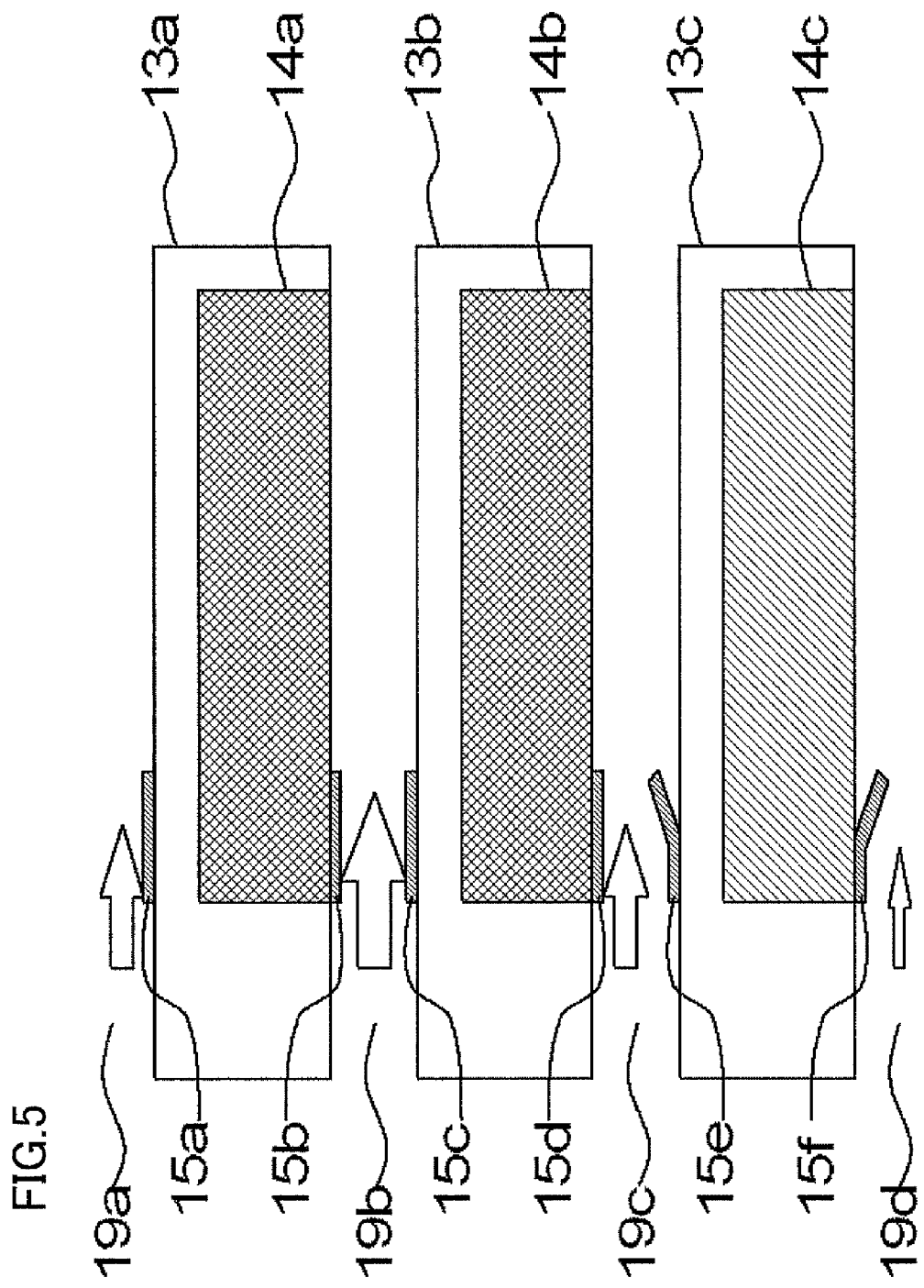
FIG. 5 is an enlarged schematic cross-sectional view of HDD units in a disk array system according to a second example of the present invention.

FIGS. 4-5 show enlarged schematic cross-sectional views of HDD units in the disk array system according to the second example of the present invention, FIG. 4 shows a state in which first to third HDDs 14a-14c are at a lower temperature (at a low amount of heat releases). FIG. 5 shows a state in which the first and second HDDs 14a, 14b become higher temperature (at a higher amount of the heat releases) and the third HDD 14c remains at a lower temperature. The first and second air flow regulators 15a, 15b are provided on the top and back surfaces of the first HDD unit 13a, and the third to sixth air flow regulators 15e-15f are also provided on both surfaces of the second and third HDD units 13b, 13c in the same way. The first to sixth air flow regulators 15a-15f are provided between adjacent HDD units or between the HDD unit and the housing and at a place opposite to the air flow regulator of the adjacent HDD unit. The second air flow regulator 15b to regulate the amount of the flow of air to the first HDD 14a, for example, is provided at a place which faces the third air flow regulator 15b to regulate the amount of the flow of air to the second HDD 14b. If the casings of the first to third HDD units 13a-13c are made from a conductor, the heats of the first to third HDDs 14a-14c can be transmitted to the first, third and fifth air flow regulators 15a, 15c, 15e provided on the top surfaces promptly, respectively.

If the first to third HDDs 14a-14c are at a lower temperature, as shown in FIG. 4, the second and third air flow regulators 15b, 15c of bent plates close a second path 19b in the same way as hinged double doors between adjacent HDD units, for example, the first and second HDD units 13a, 13b, to restrict an air flow in the second path 19b. First, third and fourth paths 19a, 19c, 19d are also in the same way as the second path 19b.

If the first and second HDDs 14a, 14b among the first to third HDDs 14a-14c become a higher temperature, as shown in FIG. 5, the heat of the first HDD 14a is transmitted to the first and second air flow regulators 15a, 15b provided in the first HDD unit 13a, and the heat of the second HDD 14b is transmitted to the third and fourth air flow regulators 15c, 15d provided in the second HDD unit 13b. These heats change the forms of the first to fourth air flow regulators 15a-15d from the bent plate to a flat plate to expend (open) the first to third paths 19a, 19b, 19c of the air. This increases the amount of the flowing air to cool the first and second HDDs 14a, 14b in which the heat generates as compared with the amount of the flowing air to cool the third HDD 14c.

The amount of the flow of the air flowing through the second path 19b between the first and second HDDs 14a, 14b and the amount of the flow of the air flowing through the third path 19c between the second and third HDDs 14b, 14c will be compared below. With respect to the second path 19b, both first and second HDDs 14a, 14b become the higher temperature, whereas, with respect to the third path 19c, only the second HDD 14b becomes the higher temperature. In this case, it is preferred that the amount of the flow of the air flowing through the second path 19b becomes greater than that through the third path 19c by broadening the width (area) of the second path 19b than that of the third path 19c. According to the present example, in the second path 19b, since the first and second HDDs 14a, 14b at both sides of the second path 19b become the higher temperature, two air flow regulators 15b, 15c at both sides can become an "open" state. Whereas, in the third path 19c, since only the second HDD 14b at one side of the third path 19c becomes the higher temperature, only the fourth air flow regulator 15d at the second HDD 14b side of higher temperature can become an "open" state, and the fifth air flow regulator 15e at the third HDD 14c side of lower temperature remains in a "close" state. This increases the amount of the flow of the air flowing through the path 19b than that through the path 19c. According to the second example, therefore, the amount of the flow of the cooling medium (the distribution) can be regulated step by step according to the heat release (the number of the heat-generators).

Figure 6:
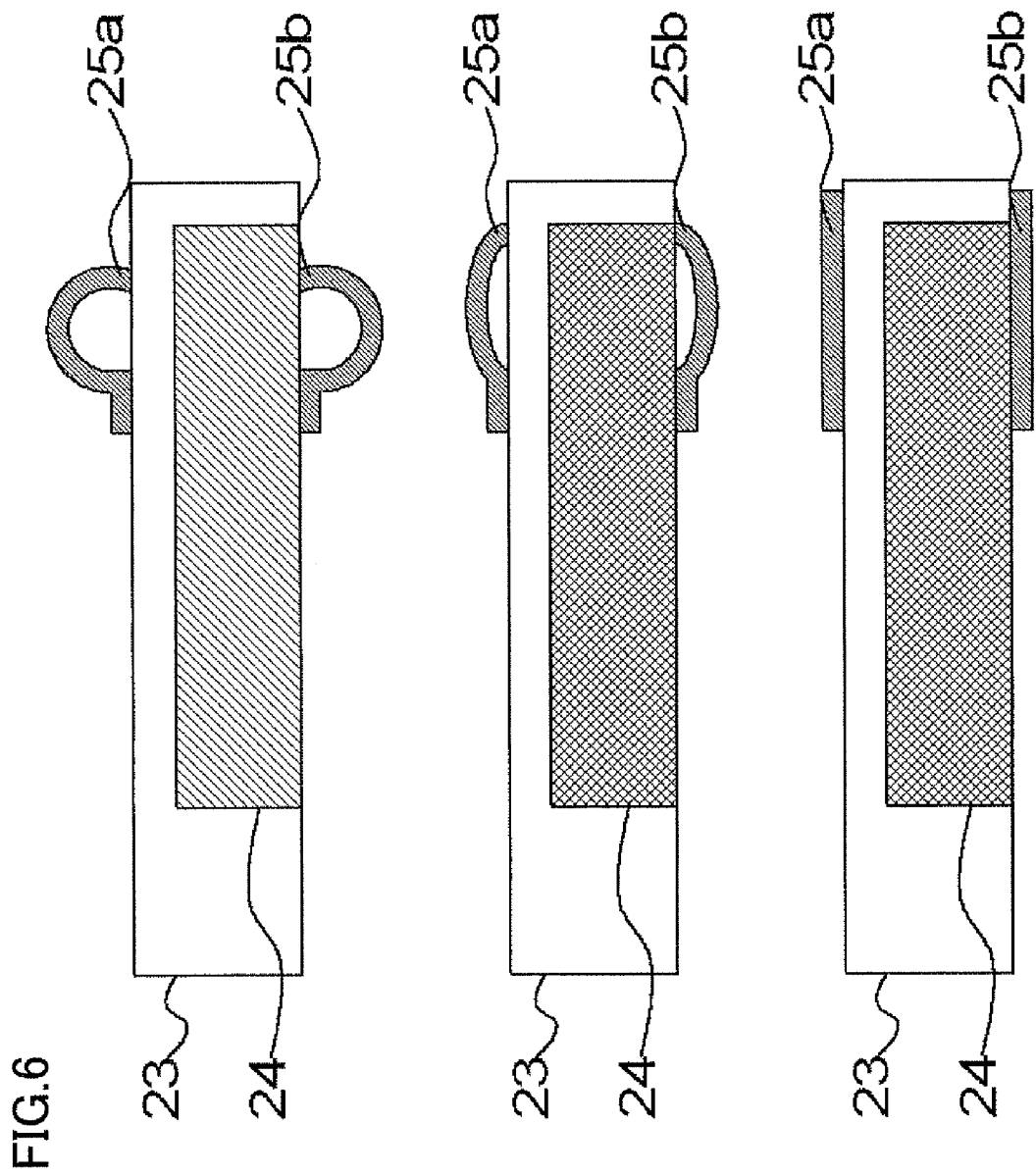
FIG. 6 is an enlarged schematic cross-sectional view of HDD units for showing another example of an air flow regulator.

In the first and second example, although the flat type of the air flow regulators is illustrated, any type may be available provided that the area (width) of the path of the cooling medium can be controlled by change in the shape (deformation or transformation). As shown in FIG. 6(a), for example, air flow regulators 25a, 25b having a curved surface may roll up to close a path when an HDD 24 is at lower temperature, and as shown in FIG. 6(b) or 6(c), the curved surfaces may extend to open the path when the HDD 24 becomes higher temperature. The position of the air flow regulator may be either at an upstream or downstream of the cooling medium flow.

Although a system of the present invention comprising a plurality of heat-generators and a cooler thereof is explained based on a disk array system comprising magnetic disk devices as an example of the heat-generators, the system of the present invention is not limited to the disk array system and can be applied to various systems. Although the system of the present invention is also explained based on a ventilation as an example of a cooler and on air as an example of a cooling medium, the cooler and cooling medium are not limited to these example, and the system of the present invention can employ various coolers and cooling mediums. Although the disk array system of the present invention is explained with reference to the above examples, the disk array system of the present invention is not limited to the above examples and can include various changes, modification and improvements.

The meritorious effects of the present invention are summarized as follows. According to the present invention, since the heat of the heat-generator (i.e., heat-generating source such as magnetic disk device, for example) is transmitted to the cooling medium flow regulator (air flow regulator, for example) directly, the amount of the flow of the cooling medium (air, for example) to the heat-generator can be regulated promptly and reliably according to the change of the temperature of the heat-generator. This can distribute the amount of the flow of the cooling medium to a plurality of the heat-generators according to the heat release of each heat-generator.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A system comprising:
    a plurality of magnetic disk devices;
    at least one ventilator that cools the magnetic disk devices; and
    air flow regulators disposed at each of said magnetic disk devices, said air flow regulators regulate the amount of flow of air to cool the magnetic disk devices by deformation in accordance with a temperature of each of said magnetic disk devices;
    wherein the heat of said magnetic disk devices is transmitted to said air flow regulators through a thermal conductor,
    a first air flow regulator of said air flow regulators being disposed on a first magnetic disk device of said magnetic disk devices opposing an adjacent air flow regulator of said air flow regulators disposed on an adjacent magnetic disk device of said magnetic disk devices, and
    said air flow regulators regulate the amount of the flow of air by controlling a width of a gap formed relative to said adjacent air flow regulator.

2. The system according to claim 1, wherein said air flow regulators are formed of a shape memory material.

3. The system according to claim 1, wherein each magnetic disk device has at least one air flow regulator, and said air flow regulator regulates the amount of the flow of said air which is in contact with the magnetic disk device to which said air flow regulator is assigned.

4. The system according to claim 1, wherein each of said air flow regulators comprises a flow regulating member that deforms in accordance with the heat of said magnetic disk device.

5. A system comprising:
    a plurality of heat-generators;
    at least one cooler that cools the heat-generators; and
    air flow regulators disposed at each of said heat-generators, said air flow regulators regulate the amount of flow of air to cool the heat generators by deformation in accordance with a temperature of each of said heat generators;
    wherein the heat of said heat-generators is transmitted to said air flow regulator directly or through a conductor,
    a first air flow regulator of said air flow regulators being disposed on a first heat generator of said heat generators opposing an adjacent air flow regulator of said air flow regulators disposed on an adjacent heat-generator of said heat-generators, and
    said air flow regulators regulate the amount of the flow of air by controlling a width of a gap formed relative to said adjacent air flow regulator.

6. The system according to claim 5, wherein each of said air flow regulators comprises a flow regulating member that deforms in accordance with the heat of said heat-generator.

7. The system according to claims 5, wherein each of said air flow regulators comprises a shape memory material.

\* \* \* \* \*